United States Patent [19]
Pastor et al.

[11] 3,935,302
[45] Jan. 27, 1976

[54] PREPARATION OF ALKALINE EARTH METAL HALIDE CRYSTALS FOR LASER WINDOWS

[75] Inventors: Ricardo C. Pastor, Manhattan Beach; Kaneto Arita, Gardena; Morton Robinson, Malibu, all of Calif.

[73] Assignee: Hughes Aircraft Company, Culver City, Calif.

[22] Filed: Feb. 27, 1974

[21] Appl. No.: 446,581

[52] U.S. Cl. ........................... 423/490; 423/497
[51] Int. Cl.$^2$ ................................ C01F 11/22
[58] Field of Search .............. 423/490, 497, 659

[56] References Cited
UNITED STATES PATENTS

| | | | |
|---|---|---|---|
| 2,149,076 | 2/1939 | Stockbarger | 423/490 UX |
| 2,550,173 | 4/1951 | Swinehart et al. | 423/490 X |
| 3,282,641 | 11/1966 | Sfiligoj et al. | 423/490 X |
| 3,565,700 | 2/1971 | Root | 423/490 X |

OTHER PUBLICATIONS

Optical Technology, Vol. 39, Number 4, Apr. 1972, pp. 213–215.

*Primary Examiner*—Edward Stern
*Attorney, Agent, or Firm*—W. H. MacAllister; B. T. Hogan, Jr.

[57] ABSTRACT

An invention directed to the preparation of laser windows from halide crystals purified by congruent growth from the melt by a reactive atmospheric processing method is disclosed. Single crystal refractory metal halides, and rare earth halides prepared by this invention can be used to produce laser windows of excellent mechanical, thermal, and optical properties.

4 Claims, No Drawings

PREPARATION OF ALKALINE EARTH METAL HALIDE CRYSTALS FOR LASER WINDOWS

RELATED APPLICATIONS

In U.S. application Ser. No. 275,130, filed July 26, 1972 by A. C. Pastor and R. C. Pastor, the use of disassociated carbon halide gas to convert a metal salt to the corresponding metal halide is disclosed. In U.S. application Ser. No. 334,179, filed Feb. 20, 1973 by R. C. Pastor, a process whereby molten metal halides are passed through a bed of carbon particles to remove oxide and hydroxide impurities is disclosed.

In U.S. application Ser. No. 349,516, filed Apr. 9, 1973 by R. C. Pastor, the treatment of metal halide laser window surfaces by exposure to gaseous nascent halogens for the purpose of improving structural properties and optical transmission is disclosed.

In U.S. application Ser. No. 351,214, filed Apr. 16, 1973 by R. C. Pastor and A. Timper, we disclosed that alkali metal halides may be purified, prior to their use as starting materials for the growth of alkali metal halide crystals, by scrubbing the material in its molten form with gaseous nascent halogens which correspond to the halide anion.

In U.S. application Ser. No. 416,899, filed Nov. 19, 1973 by R. C. Pastor, an improved alkali metal halide purification method is disclosed whereby the crystal growth starting materials are purified by scrubbing with halide-source species in their vapor phase and cast in the form of an ingot to be used directly in subsequent halide crystal growth processes.

Each of the preceding applications relate to various applications of the concept of "Reactive Atmospheric Processing" and along with this application have a common asignee and generally, commonality of inventors.

BACKGROUND OF THE INVENTION

1. Field of the Invention.

This invention is concerned with the preparation of single crystals of refractory metal halides and rare earth halides by a reactive atmosphere processing method and their use as laser windows.

2. Description of the Prior Art.

Laser window technology has been concentrated primarily in the development and evaluation of three classes of compounds: halide salts, semiconductors and non-oxide glasses. Compounds of these classes, while interesting for laser window applications, are limited by their optical absorption, mechanical or thermal characteristics. Materials which are transparent at a desired wavelength are often eliminated from consideration because they fail in one or the other of the necessary properties. The alkali metal halides generally exhibited the lowest optical absorption coefficients; however, their thermal and mechanical properties are such that the system reliability is degraded. While the semiconductors possess superior thermal and mechanical properties, they often exhibit high optical absorption coefficients when utilized for laser operations in the 10.6 $\mu$ region. Within the alkali metal halide class of compounds the most outstanding laser window material has been found to be potassium chloride (KCl). Gallium arsenide has been found to be the best laser window material within the semiconductor class ("Windows for High Power Lasers" by F. Horrigan et al, Microwaves, Jan. 1969).

It has been long recognized that one of the limiting factors affecting the usefulness of alkali metal halide crystals as laser window material is the purity of the crystal itself. Evidence has been obtained which shows that further improvements in optical absorption and mechanical integrity can be expected from technological advances in surface preparation. The improvements were noteworthy in that they were realized in the purified material, and were superior to the improvements obtained earlier by bivalent metal ion doping ["Strain Aging in $CdCl_2$-Doped Rock Salt" by L. M. Brown and P. L. Pratt, Phil, Mag. 8, 717 (1963)]. However, it has been shown that the doping technique of material purification, while upgrading the mechanical properties of the materals, exacts a tradeoff in optical absorption ($\beta$) ["Impurity-Induced Infrared Absorption in Alkali Halide $CO_2$ Laser Windows" by F. W. Patten et al, Mat. Res. Bull. 6, 1321 (1971)]. Bivalent cation impurities stabilize the hydroxide ion ($OH^-$) and cation vacancies in alkali metal halides ["Der Einflusn von $OH^-$-loen and Absorptions Spektrum und ionenleitfahigheit von KCl-Einkristallen" by B. Fritz et al, 2. Phys. 174, 240 (1963)].

The inability to effectively remove the hydroxide ion ($OH^-$) by the doping technique is probably due to its pseudo halide character in that the reactivity of the $OH^-$ is very close to that of fluoride. (See FIG. below.)

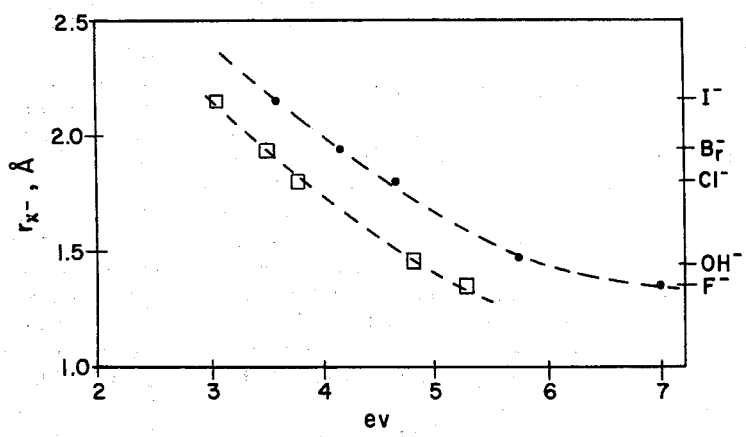

Anion Size versus the Mulliken Electronegativity (•) and the Hydration Energy (□).

From the standpoint of optical transmission, the O—H vibration is active in the 2-6 μm region and the O—M at the 9-12 μm region. The substitutional OH⁻ dipole couples with the dipole consisting of a bivalent metal ion impurity and a metal ion vacancy [B. Fritz, Supra, "Influence of OH⁻ Ions on Infrared Absorption and Ionic Conductivity in Lithium Fluoride Crystals" by T. G. Stoebe, J. Phys. Chem. Solids 28, 1375 (1967)]. Through such couplings and the tendency to diffuse to the surface, the OH⁻ can effect a degradation of the mechanical behavior and surface stability of alkali halides. Achievement of OH⁻ control in the growth of metal halide crystals has therefore constituted a major limitation to the use of these materials for laser window applications.

The concept of growing an alkaline earth fluoride crystal, a rare earth fluoride crystal or a crystal of alkaline earth fluoride-rare earth fluoride under an atmosphere containing hydrogen fluoride in order to obtain laser quality crystals which are purified of oxides and oxyfluorides is disclosed in U.S. Pat. No. 3,649,552. Our invention constitutes a significant improvement over this patent in that our process is effective in the elimination of OH⁻ ion impurities from crystals prepared by conventional methods to yield ultra high purity crystals that have excellent properties for utilization as 2-6 micron range laser window material. Our invention differs from that of U.S. Pat. No. 3,649,552 in several ways. First, we start with a conventionally grown alkaline earth fluoride crystal having known characteristics and significantly improve these characteristics by recrystallization and regrowth. Secondly, we utilize the RAP method whose chief objective is to reduce as low as possible, the pressure ratio of $H_2O/HF$ to obtain single crystals of pure alkaline earth fluorides rather than doped mixtures as taught by the patent. The control of $H_2O/HF$ in the gas phase, as taught by our invention, provides the key to the control of OH⁻ in the crystal which, as we have previously pointed out, can cause an increase in the optical absorption in the infrared. When the concentration of OH⁻ in the crystal reaches a saturation value, precipitation of a hydroxide or an oxide phase occurs. This is seen as a turbidity which is very much undesired for the use of the crystal as a laser host. (The suspended particles are scattering centers.) The concentration of OH⁻ in the crystal can be quite below saturation, rendering the clear crystal satisfactory as a laser host, but still too high for its application as a laser window in the infrared region where the OH⁻ renders the material optically absorbent at 2-6 μm and 9-12 μm.

SUMMARY OF THE INVENTION

We have found that laser windows can be prepared from metal halide and rare earth halide crystals regrown by a reactive atmosphere process (RAP) which causes the OH⁻ concentration to be extremely low. Laser windows prepared from crystals grown by the RAP technique are ultrahigh pure and have exhibited superior optical transparency, mechanical and thermal characteristics as well. Alkaline earth fluoride (e.g., $CaF_2$) windows produced from materials grown by the RAP technique are particularly useful for lasers in the 2-6 micron range and will withstand pressures of 12,000 psi compared to windows of alkaline earth fluoride crystals of the prior art, which fracture of 5,000 psi. In addition, laser windows produced from RAP grown crystals have exhibited increased transmission in the infrared range. A mixture of hydrogen halide gas, HX, and an inert gas (helium, nitrogen, etc.) can be used to obtain a low ($< 10^{-5}$) $P_{H_2O}/P_{HX}$ ratio in the following exchange:

$$X^-(c) + H_2O(g) \rightleftarrows OH^-(c) + HX(g) \qquad (1)$$

Where (c) stands for the melt or crystal at the operating temperature of congruent growth and (g) for the vapor phase. We can write the equilibrium relation, $$C(c) = \frac{[OH^-(c)]}{[X^-(c)]} = K \frac{P_{H_2O}}{P_{HX}}, \qquad (2)$$

which shows that the process parameter, $P_{H_2O}/P_{HX}$, of crystal growth is the key to the control of $C(c)$, or the OH⁻ content. The equilibrium constant, K, is fixed once the nature of the metal halide, MX, is specified because at a total pressure of one atmosphere the melting point (operating temperature for congruent growth) is also fixed. The limit to the choice in the value of $P_{HX}$ is set by the solubility of HX in (c), to avoid the problem of trapped bubbles in the crystal. The value of $P_{H_2O}$ depends on the dewpoint of the source HX and the outgassing of surfaces in the growth apparatus.

PREFERRED EMBODIMENT

The crystals may be grown by modifications to the Czochralski and the Bridgman methods. The latter is preferred because of the ease of obtaining uniform diameter control with a minimum amount of manual monitoring required. A typical run consists of the following:

The charge, in a Bridgman crucible, is introduced into an Astro furnace. A slow flow of He is started and the outlet valve is adjusted. After the equipment has been purged sufficiently, low dewpoint HF gas in a separate line is introduced. The outlet valve is throttled to the point that a slight leak of HF is maintained. The apparatus is then gradually heated until the melting point of the halide crystal is slightly exceeded. The melt is soaked in this atmosphere from 8-15 hours, after which time the programmed process of crystal growth is initiated. Crystal growth (for cylindrical diameter crystals ≈ 4.5 cm) is carried out at the rate of a few millimeters per hour. At the end of growth, the crystal is allowed to cool slowly in the presence of HF aatmosphere.

Crystals grown by the process discussed above cut with a wire saw to provide blanks which are then polished for direct use as a laser window. They may also be subjected to press forging prior to being polished.

Strength tests of RAP-grown $CaF_2$ have yielded maximum values up to 12,000 psi in flexure. After forging 25%, strength was measured up to 13,000 psi. Since asgrown pieces were cut with bar axes parallel to growth direction, and forged pieces (from a different crystal) were cut (in the plane of the flattened crystal) perpendicular to the growth direction, it is felt that higher forged strength values can be expected when optimum crystallographic directions are obtained for both growth and forging. Additionally, a degree of upset greater than 25% will increase strength even more. From these considerations, it is not unreasonable to expect strength values in the range of the 15,000 psi. Maximum strength reported in the literature for $CaF_2$ is 8,000 psi at Raytheon (Quarterly Report December 1970, ARPA Order 1180).

What is claimed is:

1. A method of preparing alkaline earth metal halide crystals for laser windows by a reactive atmosphere process comprising the steps of
   a. placing an alkaline earth metal halide crystal in a crystal growth crucible within a furnace;
   b. purging said furnace with an inert gas;
   c. causing the atmosphere within said purged furnace to become reactive with respect to anion and cation impurities by the application of low dewpoint HF gas at an input rate which maintains a positive pressure at a $P_{H_2O}/P_{HF}$ ratio less than $10^{-5}$,
   d. causing said halide crystal to melt by gradually increasing the temperature of said furnace to a point slightly above the melting point of said crystal;
   e. allowing said melt to soak in said reactive atmosphere from 8–15 hours;
   f. initiating a programmed crystal growth process with said crucible at a rate not to exceed a few millimeters per hour whereby a recrystallized crystal is formed; and
   g. allowing said crystal to slowly cool in the presence of the HF reactive atmosphere.

2. The product of claim 1 wherein the alkaline earth halide crystal is $CaF_2$.

3. The product of claim 1 wherein the alkaline earth halide crystal is $BaF_2$.

4. The product of claim 1 wherein the alkaline earth halide crystal is $SrF_2$.

* * * * *